(12) United States Patent
Schwerg et al.

(10) Patent No.: US 11,552,657 B2
(45) Date of Patent: Jan. 10, 2023

(54) DIRECTIONAL COUPLER

(71) Applicant: Comet AG, Flamatt (CH)

(72) Inventors: Nikolai Schwerg, Bern (CH); André Grede, Bern (CH)

(73) Assignee: COMET AG PLASMA CONTROL TECHNOLOGIES, Flamatt (CH)

( * ) Notice: Subject to any disclaimer, the term of this patent is extended or adjusted under 35 U.S.C. 154(b) by 71 days.

(21) Appl. No.: 17/035,003

(22) Filed: Sep. 28, 2020

(65) Prior Publication Data

US 2021/0105026 A1   Apr. 8, 2021

(30) Foreign Application Priority Data

Oct. 2, 2019   (EP) ..................................... 19200959

(51) Int. Cl.
*H01P 5/18* (2006.01)
*H04B 1/04* (2006.01)
*H03H 7/40* (2006.01)

(52) U.S. Cl.
CPC ........... *H04B 1/0458* (2013.01); *H01P 5/185* (2013.01); *H03H 7/40* (2013.01)

(58) Field of Classification Search
CPC ...... H01P 5/00; H01P 5/02; H01P 5/12; H01P 5/16; H01P 5/18; H01P 5/184; H01P 5/185; H04B 1/0458; H03H 7/40
See application file for complete search history.

(56) References Cited

U.S. PATENT DOCUMENTS

| 3,164,790 A | 1/1965 | Oh |
| 3,221,275 A | 11/1965 | Wambsganss |
| 3,506,932 A | 4/1970 | Beurrier |
| 6,686,812 B2 | 2/2004 | Gilbert et al. |
| 8,044,749 B1 | 10/2011 | Witas et al. |
| 2003/0218516 A1 | 11/2003 | Gilbert et al. |
| 2010/0026415 A1 | 2/2010 | Mann et al. |

FOREIGN PATENT DOCUMENTS

| CN | 1412887 A | 4/2003 |
| DE | 19647315 A1 | 5/1997 |
| DE | 102014009141 A1 | 12/2014 |
| WO | 2013/017397 A1 | 2/2013 |

OTHER PUBLICATIONS

Extended European Search Report for Application No. 19200959.5-1205 dated Apr. 3, 2020.
European Search Report issued in connection with corresponding European Application No. 19 20 0959 dated Mar. 25, 2020.
Office Action for corresponding CN202011041267.7, dated Apr. 25, 2022.

*Primary Examiner* — Stephen E. Jones
(74) *Attorney, Agent, or Firm* — Tarolli, Sundheim, Covell & Tummino LLP

(57) ABSTRACT

The invention relates to a directional coupler comprising a non-straight main conductor line for receiving a high power signal and at least one coupling element. The main conductor line is arranged to run in a plane $P_0$. The at least one coupling element is arranged sectionally parallel to the main conductor line. Further, the invention relates to a method for measuring RF voltage and/or RF power using a directional coupler. The method comprises the steps of combining the measured signals of the directional coupler and the measured voltage and current values of the VI sensor unit. In case, one of the measured signals has a low or zero level the sensitivity of the measuring of RF voltage and/or RF power is increased.

12 Claims, 10 Drawing Sheets

Figure 1:
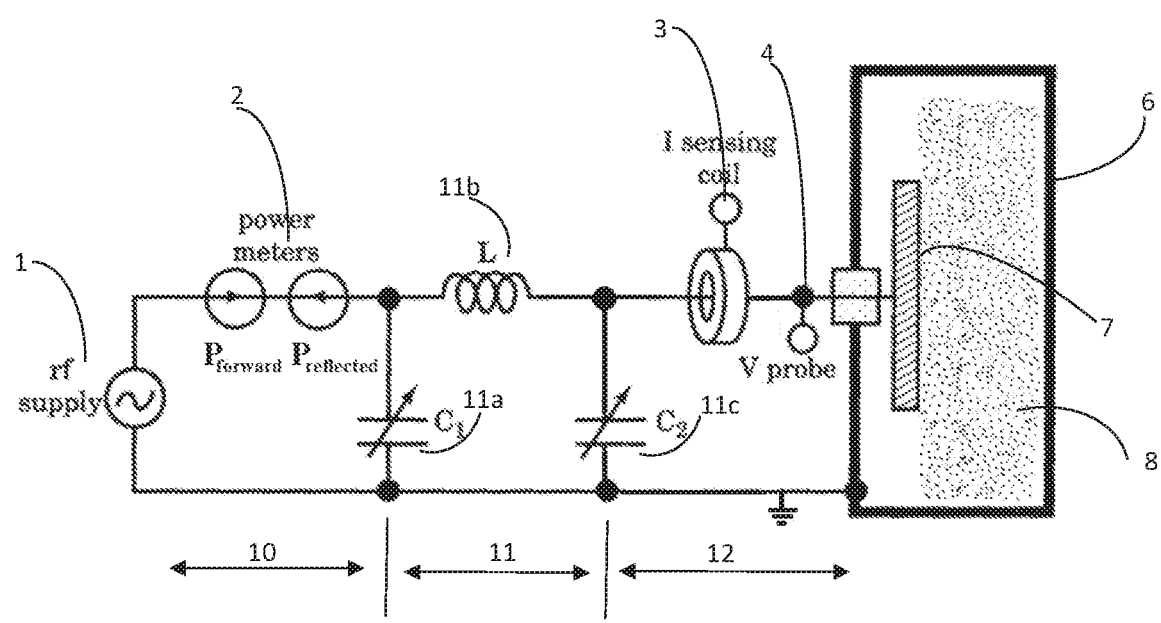

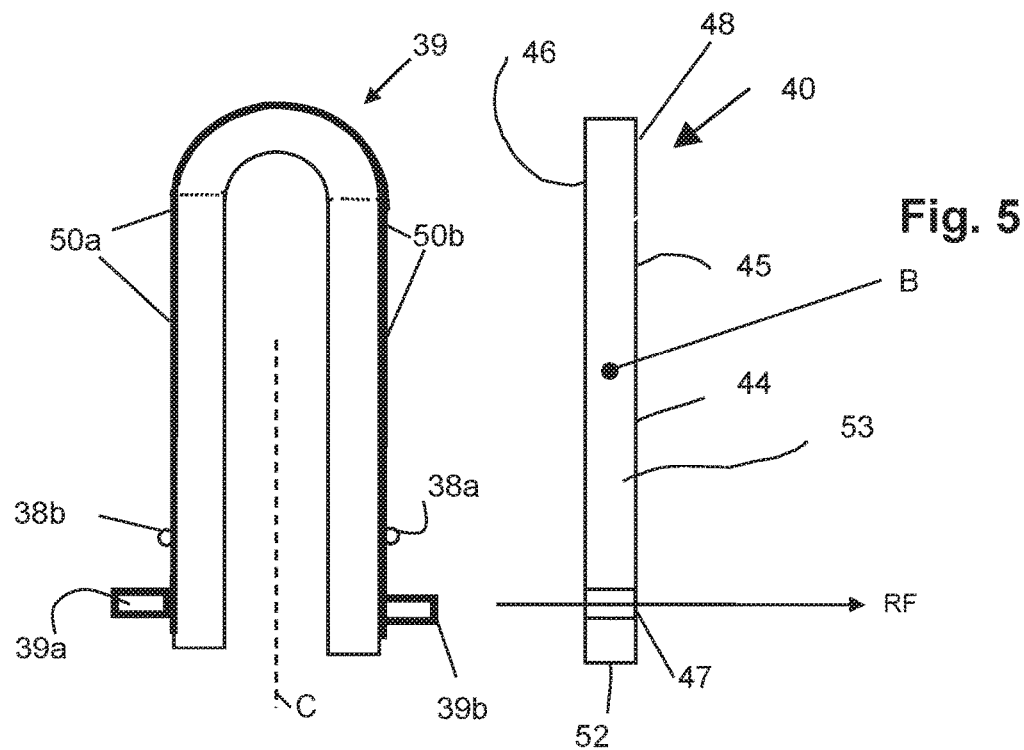
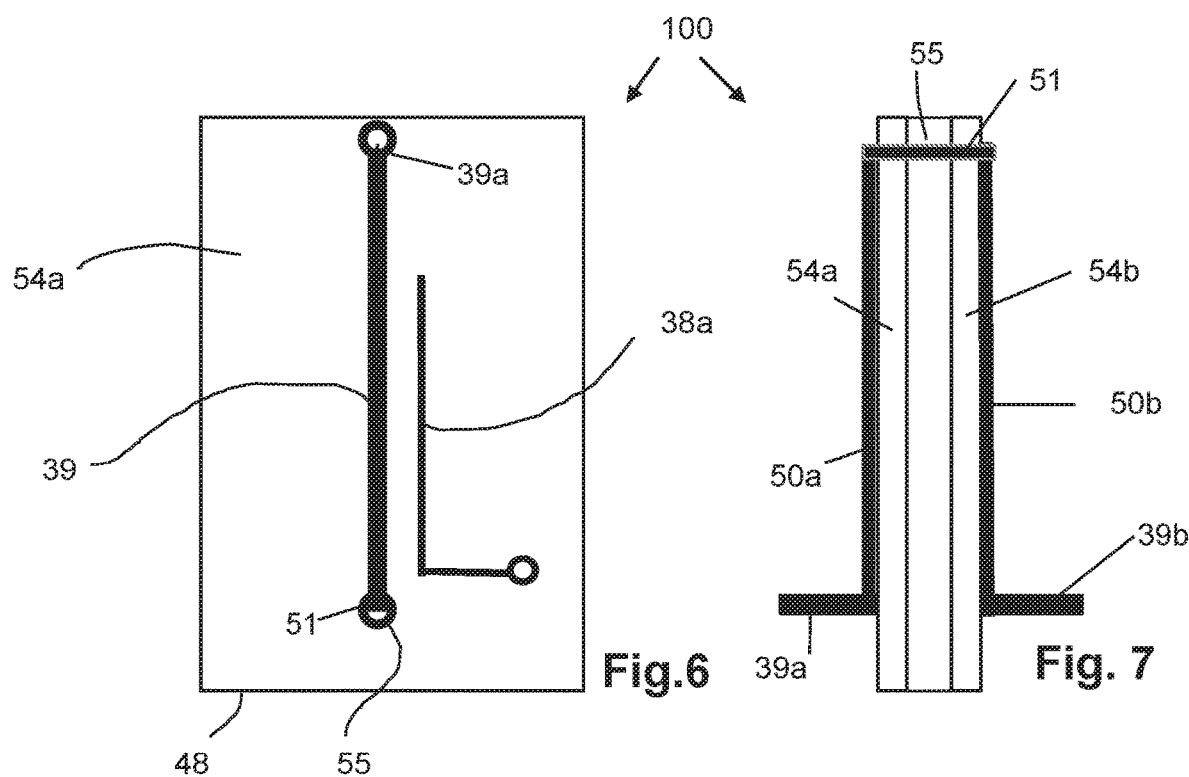
Fig. 5
Fig. 6
Fig. 7

DIRECTIONAL COUPLER

RELATED APPLICATIONS

The present invention is a Nonprovisional Application under 35 USC 111(a), claiming priority to Serial No. EP 19200959.5, filed on 2 Oct. 2019, the entirety of which is incorporated herein by reference.

The invention relates to a directional coupler comprising a non-straight main conductor line for receiving a high power signal and at least one coupling element. The main conductor line is arranged to run in a plane $P_0$. The at least one coupling element is arranged sectionally parallel to the main conductor line.

Further, the invention relates to a method for measuring RF voltage and/or RF power using a directional coupler. The method comprises the steps of combining the measured signals of the directional coupler and the measured voltage and current values of the VI sensor unit. In case, one of the measured signals has a low or zero level the sensitivity of the measuring of RF voltage and/or RF power is increased.

Furthermore, the invention relates to a method for impedance matching a power generator output radio-frequency signal with a load impedance created by a plasma-processing chamber. The method comprises the steps of generating a radio-frequency signal; amplifying the radio-frequency signal into a high power radio-frequency signal at the output of a radio-frequency generator, of providing the high power radio-frequency signal from the output of the generator to electrodes of a plasma processing chamber, of measuring a forward-reflected power characteristic using a directional coupler according to the invention to sample the power delivered into the plasma processing chamber and of adjusting either the radio-frequency signal generation or the amplification of the radio-frequency signal based on the sampling of the power delivered into the plasma of the plasma processing chamber.

Directional couplers are circuit elements which are used at radio frequency and which have the property of dividing a signal, which is fed into an input port, into two output ports in a defined way. The distribution of the signal components to the two output ports does not have to be uniform. In the case of a directional coupler with four ports, one port is "decoupled", i.e. no signal components are output at this gate in the ideal case. In the case of a port considered individually, the allocation to the remaining ports depends on the direction of the signal or the waves through this port. This is therefore referred to as a directional coupler.

Radio frequency (RF) generators, sometimes also called "RF power supplies", are used to generate radio-frequency power suitable for delivery into an application. From the electric point of view, the application presents a load to the power delivery circuit. The load has an electric impedance, which determines how well the power is transmitted to the load (to the application). Examples of radio-frequency power applications include deposition and etching processes by generating plasma in dedicated plasma processing chambers. These processes are very common in the semiconductor manufacturing industry for which frequencies of 13.56 MHz, 27.12 MHz, 40.68 MHz, or any other appropriate frequency or combination of frequencies may be used. The power levels involved in supplying plasma processing chambers can be for example 100 W to 1000 W, or more than 1000 W. Other applications also exist, including powering radio antennas, wireless power transfer and dielectric heating, just to name a few.

When the load impedance is not matched with the power supply impedance, the power is not properly transmitted into the load (due to impedance mismatch). Because the impedance of the load can vary with a multitude of parameters (such as gas type, gas pressure, ionization degree of the gas particles in the case of a plasma processing application) and is therefore typically unknown, it is necessary to monitor the power that is actually supplied to the load. One possibility is to monitor forward power (the fraction actually transmitted to the application) and reflected power (the fraction reflected and thus not available to the application). The physical origin of reflected power is impedance mismatch. Directional couplers are known probing elements to monitor forward and reflected power and to provide feedback to the controller of the generator so that the power signal can be adjusted (in amplitude, phase, frequency, waveform or other characteristics) in order to result into a high and stable transmitted power fraction with little or no reflected power.

In other words, this allows the radio-frequency generator to be stabilized in such a way that the absorbed power in the load can be tuned and kept constant (impedance matched). To be able to measure the radio-frequency power supplied in the direction of the load as well as the reflected power, it is common to use directional couplers, which have secondary lines with regard to a main conductor line transmitting radio-frequency power towards the direction of the load. The power supplied in the direction of the load can be measured via one secondary line and the reflected power can be measured via a further secondary line. Due to the supply of the radio-frequency power via the main line, electromagnetic fields are generated which are coupled to the secondary lines so that measurement signals can be recorded on the secondary lines which are related to the power on the main line towards the load ("forward") and the reflected power, respectively.

Another probing element, which can be used, is a voltage-current probe (so-called VI probe). The information gained from amplitude and phase information of a VI probe is basically equivalent to reflected/forward information gathered thanks to a directional coupler as both techniques allow in theory to deduce the impedance of the load and give that feedback to the generator while in operation.

However, the impedance measurement only by means of a directional coupler (forward and reflected power) or only by means of a VI probe disadvantageously has a poor resolution regarding very small measurement values. When measuring by means of a directional coupler and the reflected power is very small it is difficult to accurately measure such value. When measuring by means of a VI probe and the voltage or the current is very small or almost at zero value, it is difficult to measure those voltage or current values with great accuracy.

Usually, the used directional couplers in the prior art extend very much in the longitudinal direction of the main conductor line. Therefore, such directional couplers disadvantageously require a significant amount of space in this direction and consequently negatively affect the size of a radio frequency generator.

WO 2013/017397 A1 discloses a DC-isolated directional coupler, in particular for coupling in and out high-frequency measurement signals of a radar fill level meter. The radar fill meter comprises two conductor tracks, which engage in one another and are bent in opposite directions. The two oppositely bent conductor tracks are arranged in such a way that they are coupled to one another over a region of one quarter wavelength ($\lambda/4$) of the wavelength associated with the mid-frequency of the measurement signals and form two groups of side-coupled conductor tracks. Further, a bent conductor track piece adjoins each of the two groups of side-coupled conductor tracks, in each case over a region which is smaller than one-eighth wavelength (λ/8) of the wavelength associated with the mid-frequency.

DE 10 2014 009 141 A1 discloses a converter using a RF-communication signal. The converter is arranged on a chip, using a plurality of pairs of transmission lines bended with a U-shape.

DE 196 47 315 A1 discloses an element with coupled lines by an electromagnetic field. The lines are formed like a spiral.

Object of the invention is to provide a compact sized directional coupler, which simplifies its implementation. It is a further object of the invention to provide a directional coupler integrating a VI probe, which improves the resolution of impedance measurements by means of a directional coupler and which allows a space-saving arrangement of multiple probing elements.

This object is solved by a directional coupler, which comprises a non-straight main conductor line for receiving a high power signal and at least one coupling element. The main conductor line is arranged to run in a plane $P_0$. The at least one coupling element is arranged sectionally parallel to the main conductor line.

Further, the object is solved by a method for measuring RF voltage and/or RF power using a directional coupler. The method comprises the steps of combining the measured signals of the directional coupler and the measured voltage and current values of the VI sensor unit. In case, one of the measured signals has a low or zero level the sensitivity of the measuring of RF voltage and/or RF power is increased.

The inventive directional coupler allows reducing the spatial dimension of the inventive directional coupler. Advantageously, this also improves the implementation of the inventive directional coupler into radio-frequency delivery equipment, such as for example a radio-frequency generator or an impedance matching network, because based on a more compact size of the inventive directional coupler implementing of such a compact component into a is easier or simpler. Further, this also allows saving costs in manufacturing radio frequency power delivery equipment.

Furthermore, the usage of a directional coupler comprising a VI probe advantageously raises the resolution of impedance measurement for certain values of the impedance as will become clearer with reference to a Smith chart discussed later in this description. This is based on the VI probe measurement characteristics, which advantageously supplements the resolution of very small measurement values in such areas in which the measurements by means of the directional coupler are poor. Therefore, the combination of directional coupler and VI probe upgrades certain measurement values or impedance measuring in all areas of the so-called smith chart.

According to a first embodiment of the first aspect of the invention, the main conductor line of the directional coupler comprises two straight sections and a third section.

According to a second embodiment of the first aspect of the invention, the two straight sections and the third section are shaped to essentially create a U-shaped main conductor line.

According to a third embodiment of the first aspect of the invention the directional coupler is arranged on a circuit board, in particular a printed circuit board.

It is very convenient if the circuit board is arranged as a printed circuit board, known as a PCB. The printed circuit board comprise a carrier flat plate or flat layer of electrically isolating material. Conducting lines of copper material, for example, can be printed on the board by an etching process. The main conductor line and the sensor lines can be copper traces. Optionally, the circuit board is arranged as a flexible and/or thin printed circuit board.

According to a fourth embodiment of the first aspect of the invention the circuit board comprises a first and a second circuit board part. Each of the at least two straight sections is arranged on the respective printed circuit board parts. The at least two conductor sections are connected by the third section, wherein the third section is a connection bridge or a contact passing through the first and the second circuit board parts.

According to a fifth embodiment of the first aspect of the invention the third section is arranged in a plane essentially perpendicular to each of the at least two straight sections.

According to a sixth embodiment of the first aspect of the invention the third section and the at least two straight sections are configured as a one-piece or multi-part main conductor line.

According to a seventh embodiment of the first aspect of the invention, the directional coupler further comprises a VI-sensor unit for measuring a voltage (V) and a current (I). The VI-sensor unit is arranged adjacent to one of the at least two straight sections and in parallel to the circuit board.

This advantageously enables the directional coupler to be used in a wide frequency range and to accurately measure the frequency for different applications. Optionally, a further VI-sensor can be arranged in parallel to the first VI-sensor, but on the opposite side of the circuit board or directional coupler.

According to an eighth embodiment of the first aspect of the invention the VI-sensor unit further comprising a flat case with flat sides and with a flat inner surface, and the flat inner surface is arranged adjacent to one of the at least two straight sections and in parallel to the circuit board.

According to a ninth embodiment of the first aspect of the invention the VI-sensor unit comprises a flat case with flat sides with a flat inner surface and a flat outer surface. The flat inner and the flat outer surface are arranged essentially at the same plane and in continuation of a small side or top side of the directional coupler on the circuit board.

According to a tenth embodiment of the first aspect of the invention the directional coupler and the main conductor line are arranged on multiple circuit boards forming a multi-layered structure. Each of the multiple circuit boards comprises the first and the second circuit board parts. Each of the at least two straight sections is arranged on the respective printed circuit board parts of each of the multiple circuit boards.

According to an eleventh embodiment of the first aspect of the invention the directional coupler and the main conductor line are arranged on two circuit boards forming a two-layer structure, and the two circuit boards having a distance and an angle to each other.

According to a twelfth embodiment of the first aspect of the invention the two circuit boards are jointly arranged on a metallic ground layer.

According to a second aspect of the invention a method for measuring RF voltage and/or RF power, which uses a directional coupler according to the first aspect of the invention comprises the steps of combining the measured signals of the directional coupler and the measured voltage and current values of the VI sensor unit. In case, one of the measured signals has a low or zero level, comprises a further step of increasing the sensitivity of the measuring of RF voltage and/or RF power.

According to a third aspect of the invention a method for impedance matching a power generator output radio-frequency signal with a load impedance created by a plasma processing chamber comprises the steps of generating a radio-frequency signal Amplifying the radio-frequency signal into a high power radio-frequency signal at the output of a radio-frequency generator. Providing the high power radio-frequency signal from the output of the generator to electrodes of a plasma processing chamber. Measuring a forward-reflected power characteristic using a directional coupler according to the first aspect of the invention, to sample the power delivered into the plasma-processing chamber. Adjusting either the radio frequency signal generation or the amplification of the radio frequency signal based on the sampling of the power delivered into the plasma of the plasma-processing chamber.

According to further aspects, the invention comprises the following features or grouped features:

The directional coupler according to the first aspect of the invention comprises a non-straight main conductor line for receiving a high power signal and at least one coupling element. The non-straight main conductor line is arranged to run in a plane $P_0$. A further plane S is perpendicular to plane $P_0$ and the at least one coupling element is arranged to run in the plane S, wherein the at least one coupling element is arranged sectionally parallel to the main conductor line.

This placement of the components of the directional coupler allows a non-planar arrangement or a non-planar directional coupler, because the main conductor line and the coupling elements are located on two different planes $P_0$ and S, which are arranged perpendicular. Further, this arrangement enables a space saving arrangement of directional coupler.

The directional coupler according to the first aspect of the invention comprises the further plane S, which has a surface and the shape of the surface of plane S is dependent on the form of the main conductor line.

The directional coupler according to the first aspect of the invention comprises the plane $P_0$, which has a surface and the course of the main conductor line is dependent on the spatial shape of the surface of plane $P_0$. The shape of the surface of plane $P_0$, is a single curved or multiple curved plane P.

The directional coupler according to the first aspect of the invention comprises the main conductor line, wherein the main conductor line or the course of the maim conductor line is defined by the intersection of the two surfaces of the planes P and S.

The invention will be described in details with regard to different exemplary embodiments in the following figures:

SHORT DESCRIPTION OF THE DRAWINGS

Figure 2A:
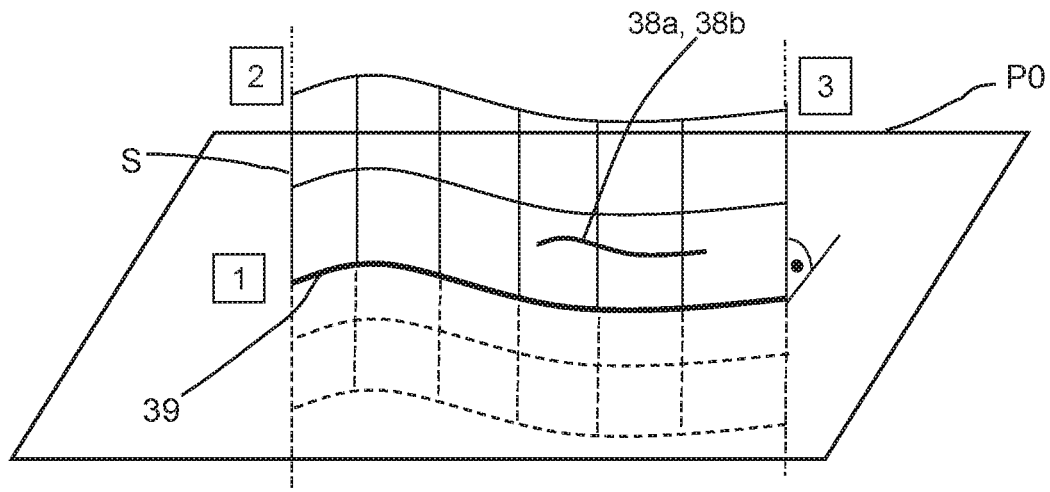
Figure 2B:
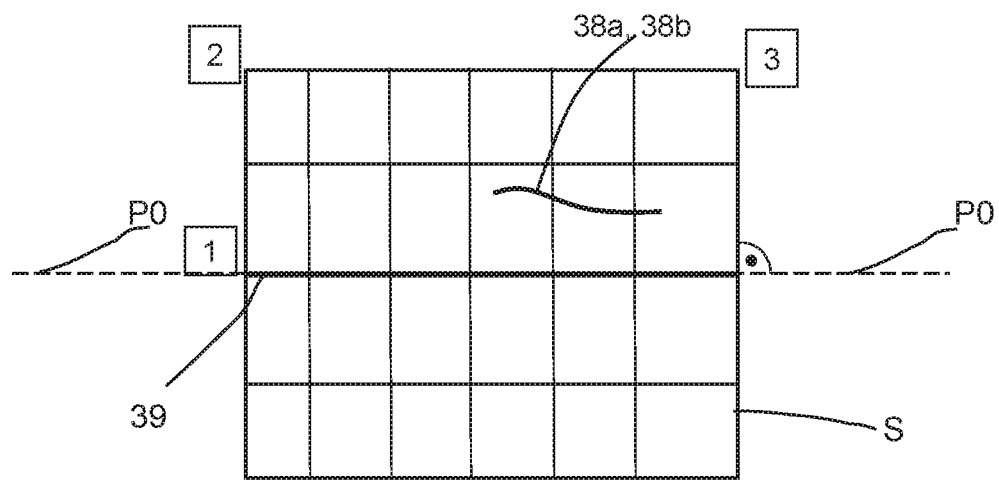
Figure 2C:
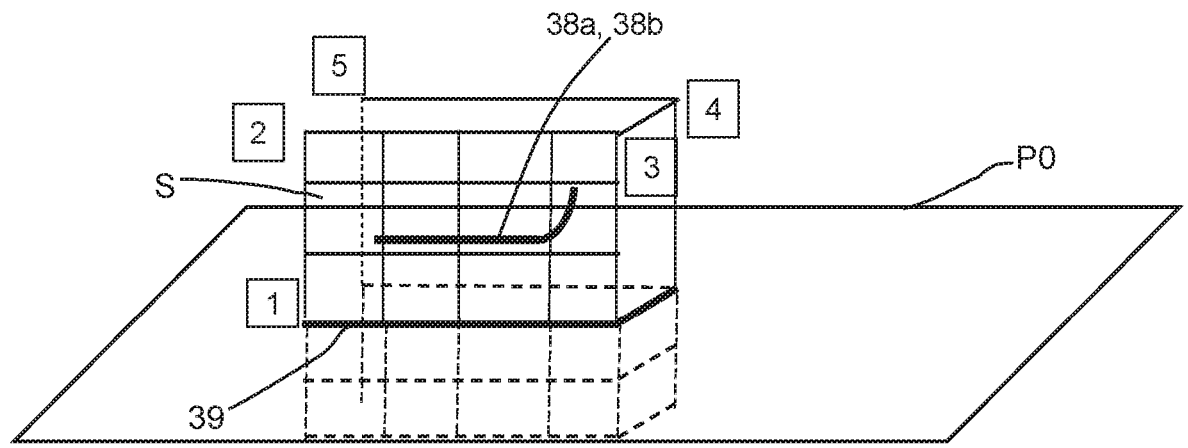
Figure 2D:
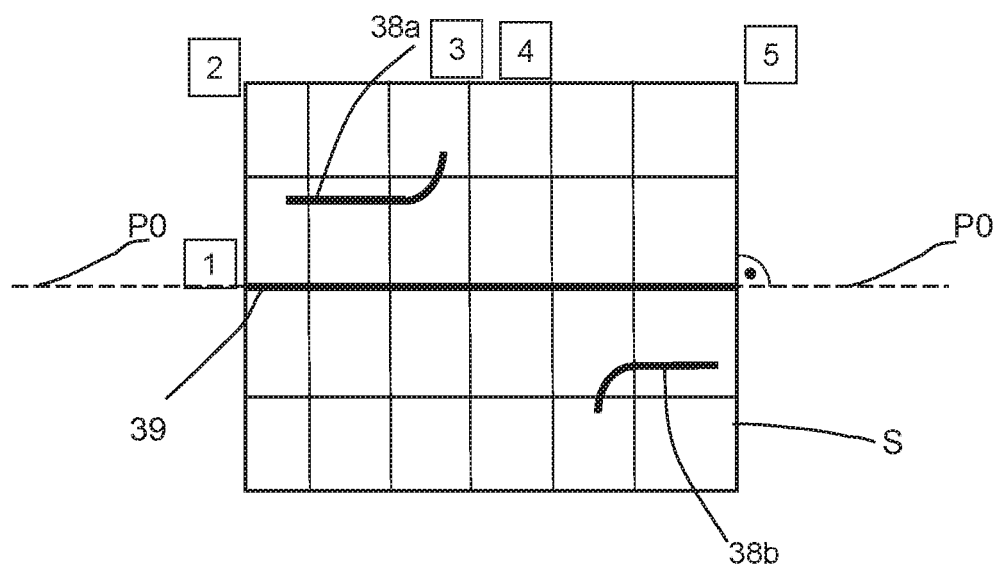
Figure 2E:
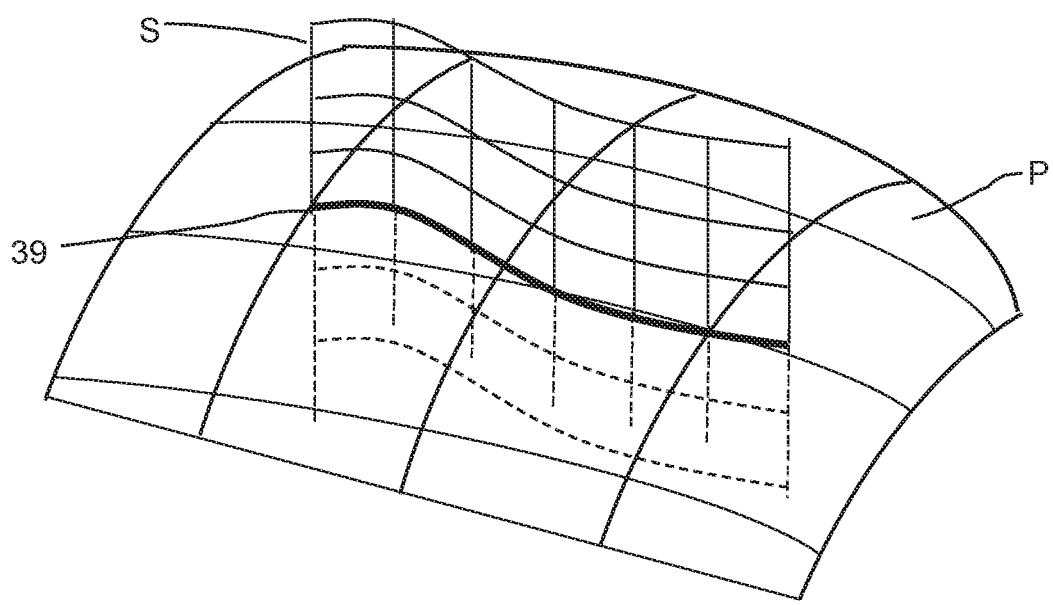
Figure 3:
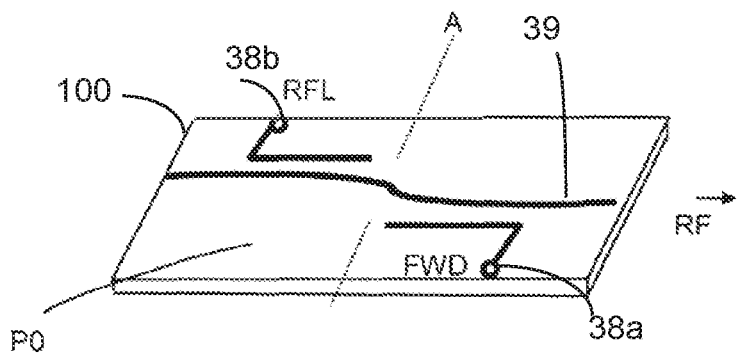
Figures 3A, 3B:
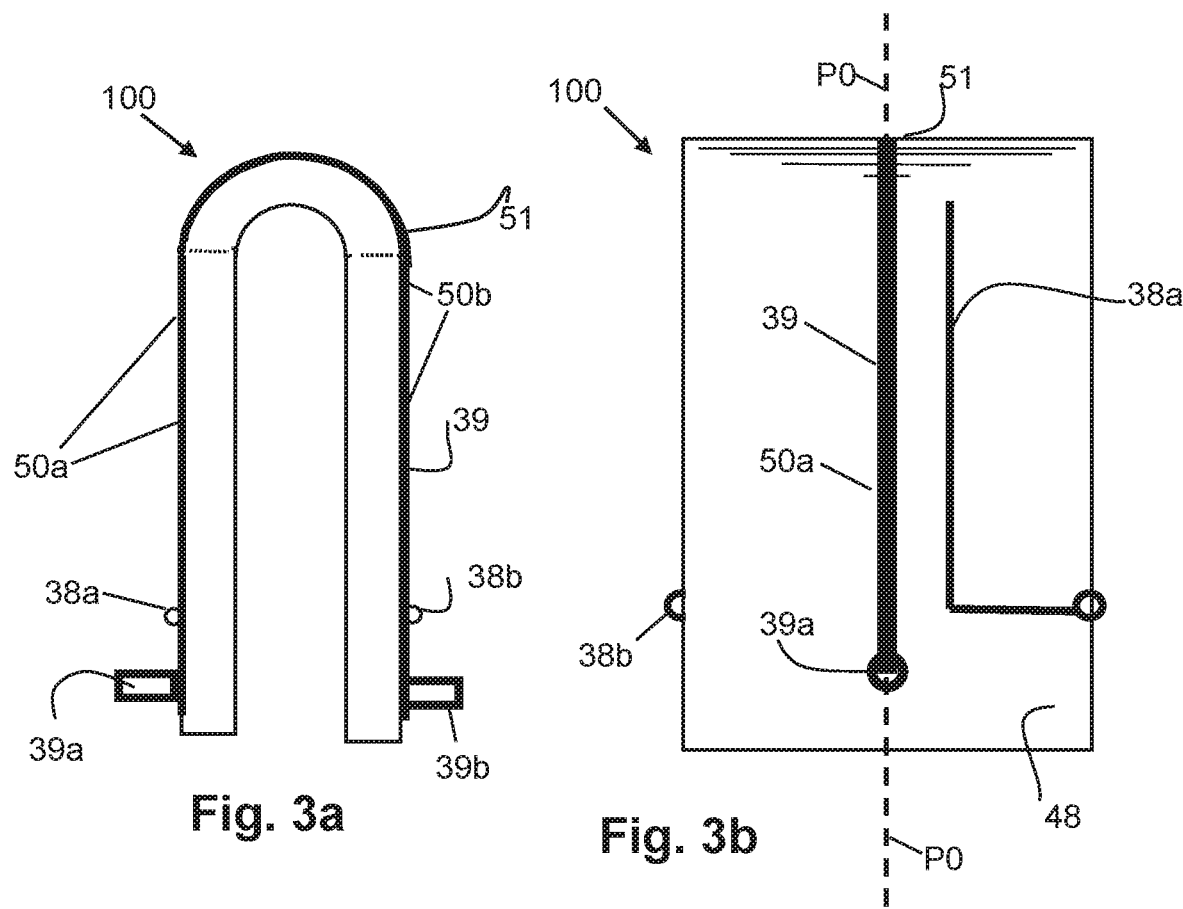
Figure 4:
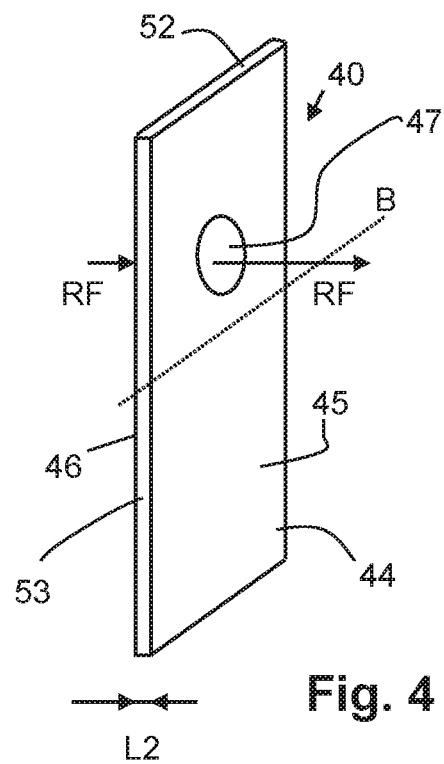
Figure 4A:
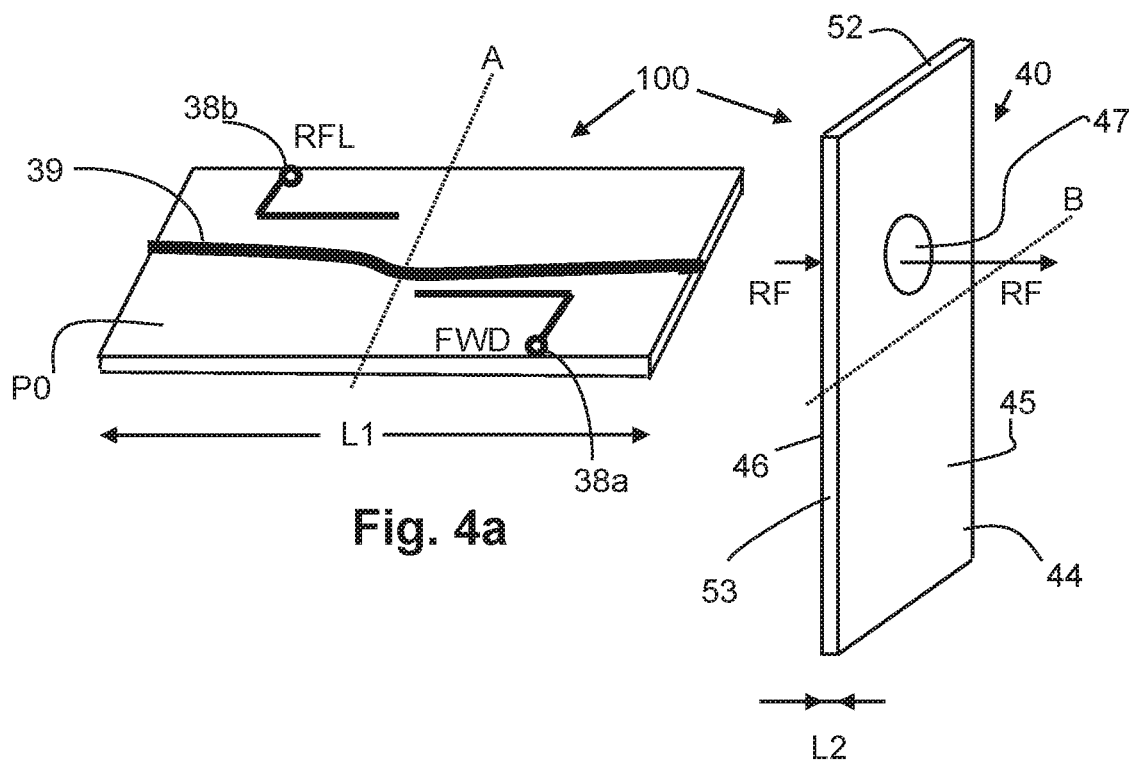
Figure 8:
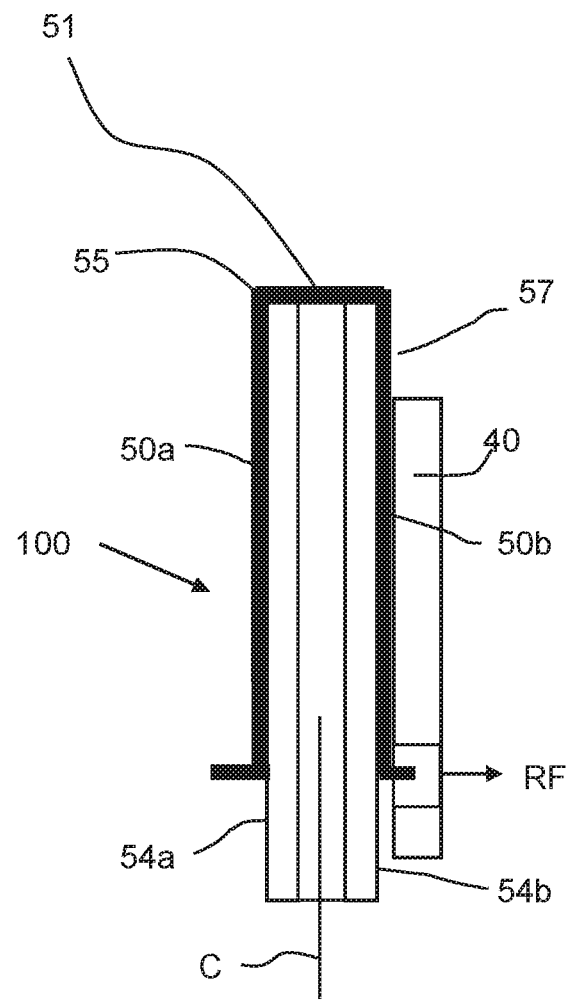
Figure 9:
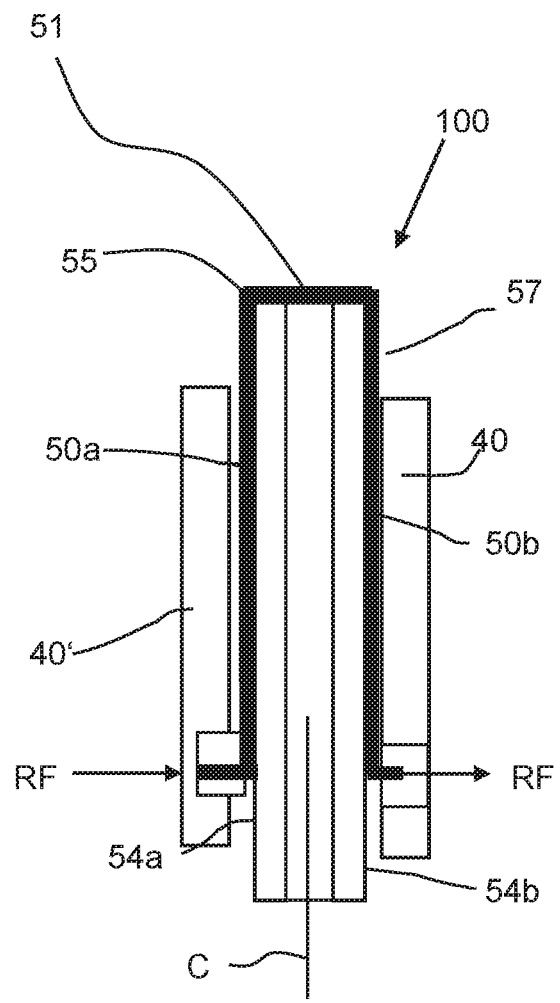
Figure 10:
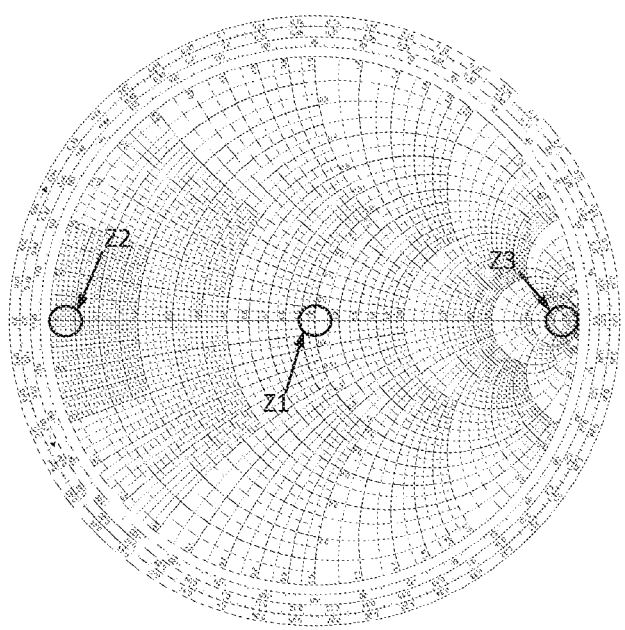

FIG. 1 shows an exemplary set up of supplying radio-frequency power from a radio-frequency generator to a load, FIG. 2*a* depicts a schematic 3D-view of a spatial arrangement of components of the directional coupler according to the invention, FIG. 2*b* depicts a schematic 2D-view of the spatial arrangement of components depicted in FIG. 2*a*, FIG. 2*c* depicts a schematic 3D-view of a further spatial arrangement of components of the directional coupler according to the invention, FIG. 2*d* depicts a schematic 2D view of the spatial arrangement of components depicted in FIG. 2*c*, FIG. 2*e* depicts a schematic 3D view of another spatial arrangement of components of the directional coupler according to the invention, FIG. 3 shows a schematic view of an embodiment of the directional coupler according to the invention, FIG. 3*a* shows a schematic diagram of a further embodiment of the directional coupler according to the invention, FIG. 3*b* shows a schematic side view of the embodiment of the directional coupler of FIG. 3*a*, FIG. 4 shows a schematic view of a VI sensor unit or VI probe, FIG. 4*a* shows a schematic view of a further embodiment of a directional coupler FIG. 5 shows a schematic side view of another further embodiment of the directional coupler, FIG. 6 shows a schematic view of a further embodiment of the directional coupler, FIG. 7 shows a schematic side view of another further embodiment of the invention, FIG. 8 depicts a schematic view of another embodiment of the invention, FIG. 9 depicts a schematic view of a further embodiment of the invention, FIG. 10 depicts areas Z1 to Z3 in a Smith diagram or Smith chart regarding measurements of certain values of impedance.

FIG. 1 depicts an exemplary radio-frequency power circuit for supplying radio-frequency power from a RF generator to a load. The circuit comprises a radio-frequency generator 1. The RF generator is typically configured to supply high power (for example 1000 W or more) with a frequency of 13.56 MHz, optionally other frequencies are possible. The radio-frequency power circuit further comprises a pick-up with so-called power meters 2. These power meters 2 are as an example configured as directional couplers, which measure the forward and the reflected radio-frequency power, therefore giving information about the delivered power. Further, FIG. 1 shows an I sensing coil 3 for measuring the current I and a V probe 4 for measuring the voltage V. Often the voltage and current measuring is performed in combination by a so-called VI probe 5. The circuit also comprises a load 6 such as a plasma chamber 6 is depicted comprising an electrode 7 and a plasma 8. From a structural perspective the radio-frequency power circuit typically comprises an impedance matching network 11 comprising variable capacitors C1 11*a* and C2 11*c* and a coil L 11*b*. This network 11 matches the impedance to the plasma load.

FIG. 2*a* depicts a schematic 3D-view of a spatial arrangement of components of the directional coupler according to the invention. FIG. 2*a* shows a plane $P_0$. The main conductor line 39 is arranged to run on plane $P_0$. The main conductor line 39 is non-straight or the course of the main conductor line 39 is non-straight. Optionally the main conductor line is curved, bent, or sectionally straight. A further plane S is arranged perpendicular to the plane $P_0$. The main conductor line 39 is arranged to run on plane S or is included in plane $P_0$. A coupling element 38*a*, 38*b* is arranged to run in plane S or is included in plane S. The coupling element 38*a*, 38*b* is arranged sectionally parallel to the main conductor line 39. The boxed numbers 1, 2 and 3 indicate reference points for easier orientation in 2D and 3D view. The main conductor line 39 is defined by the intersection of the two surfaces of the planes $P_0$ and S.

FIG. 2*b* depicts a schematic 2D-view of the spatial arrangement of components depicted in FIG. 2*a*. The components are the same as already described in FIG. 2*a*.

FIG. 2c depicts a schematic 3D-view of a further spatial arrangement of components of the directional coupler according to the invention. The components are already described in FIG. 2a. Different from FIG. 2a, the main conductor line 39 is shaped like a hair-pin. On both sides of the main conductor line, there are two coupling elements 38a, 38b, which are arranged in parallel to the main conductor line 39. The plane S includes the main conductor line 39 and shapes the surface of the plane S according or dependent on the shape of the main conductor line 39. The main conductor line 39 is defined by the intersection of the two surfaces of the planes $P_0$ and S.

FIG. 2d depicts a schematic 2D view of the spatial arrangement of components depicted in FIG. 2c. The components are already described in FIG. 2c.

FIG. 2e depicts a schematic 3D view of another spatial arrangement of components of the directional coupler according to the invention. Different from the other embodiments depicted in FIGS. 2a and 2c in this embodiment the plane $P_0$ is curved thus giving the shape of a non-planar plane P. The main conductor line 39 is defined by the intersection of the two non-planar surfaces of the planes P and S.

FIG. 3 depicts an embodiment of a directional coupler 100 according to the invention comprising a non-straight main conductor line 39 for receiving a high power signal and at least one coupling element 38a, 38b. The main conductor line 39 is arranged to run in a plane (P0) and the at least one coupling element 38a, 38b is arranged sectionally parallel to the main conductor line. The sensor lines for measuring the FWD power and the reflected (RFL) power are optionally arranged in the same plane.

FIG. 3a depicts a schematic view of a further embodiment of the directional coupler according to the invention. The directional coupler 100 comprises a non-straight main conductor line 39 for receiving a high power signal and at least one coupling element 38a, 38b. The main conductor line 39 is arranged to run in a plane $P_0$ and the at least one coupling element 38a, 38b is arranged sectionally parallel to the main conductor line. The two straight sections 50a, 50b and the third section 51 are shaped to essentially create a U-shaped main conductor line 39.

FIG. 3b depicts an embodiment of the directional coupler 100, wherein the main conductor line 39 is arranged on a circuit board 48 and two coupling elements 38a, 38b adjacent to the main conductor line 39. In this embodiment, the printed circuit board 48 is bendable. The main conductor line 39 runs along the circuit board and can be a mostly straight or curved or wrapped or bent conductor line 39 provided it is within a plane $P_0$. In this Figure, the plane $P_0$ is the plane perpendicular to the surface 48, which contains the main conducting line 39. The third section 51 of the main conductor line 39 follows the bendable circuit board and joins the two straight sections 50a and 50b.

FIG. 4 depicts a VI-sensor unit 40. The VI-sensor unit 40 or VI-probe-sensor element 40 is configured for measuring a voltage and a current, and thus, for measuring the output power. The VI-sensor unit 40 comprises a flat case 44 with flat sides 45 with a flat inner surface 46. The RF-power line passes through an opening 47 of the VI-sensor unit 40. The VI-sensor unit shown in FIG. 4 has a rectangular parallelepiped shape with two small sides 52 and two long sides 53 in addition to the above already mentioned flat sides 45 and 46. The opening 47 of the VI-sensor unit 40 is optionally arranged asymmetrically to a centre line B of the VI-sensor unit 40. The centre line B is arranged perpendicular to a RF-power line direction (parallel to the surface 45) and is in parallel to the small sides 52 of the VI-sensor unit 40. As is known from prior art, a VI probe consists of an inductively coupled element and a capacitively coupled element. These elements can be arranged in a rectangular parallelepiped shaped box. The inductive element can be realized as a Rogowski coil. The Rogowski coil can be arranged for example around the opening 47 of the VI probe shown in FIG. 4.

FIG. 4a depicts as an embodiment of the invention in combination with the VI-sensor unit 40. The VI-sensor unit comprises a flat case 44 with flat sides 45 with a flat inner surface 46. The RF-power line or main conductor line 39 passes through an opening 47 of the VI-sensor unit 40. According to the prior art the length L1 of the directional coupler 100 comprises a certain length. This length L1 in combination with the thickness L2 and the spatial propagation of the VI-sensor unit 40 perpendicular to the length L1 (not shown) determines the necessary space requirements for the directional coupler 100 comprising a VI sensor unit 40 sensor, which can take a lot of place.

In the embodiment shown in FIG. 5, the flat inner surface 46 of the VI-sensor unit 40 is arranged adjacent to one straight section 50b of the directional coupler 100. The VI-sensor unit 40 comprises the flat case 44 with flat sides 45 with the flat inner surface 46. The VI-sensor unit 40 has the measuring opening 47 for receiving the output line section 39b of the main conductor line 39. Although this embodiment is shown with the output line 39b being received by the measuring opening 47 of the VI probe, it is clear that any other section of the main conductor line 39 can be received by the measuring opening 47 of the VI probe, including for example the input line section 39a. The opening 47 of the VI-sensor unit 40 is optionally arranged asymmetrically to a centre line B of the VI-sensor unit 40. The centre line B is arranged perpendicular to a RF-power line direction of the main conductor line 39 and is arranged in parallel to the small sides 52 of the VI-sensor unit 40.

The VI sensor unit 40 can be accommodated on a printed circuit board 48. The straight sections 50a and 50b of the main conductor line 39 of the directional coupler can also be accommodated on (another) circuit board as already discussed with FIG. 3a. Alternatively, both the VI sensor unit 40 and the directional coupler 39 can be integrated into one sensing unit by accommodating them onto two adjacent circuit boards or two parts of a same circuit board.

FIG. 6 and FIG. 7 depict further embodiments of the directional coupler 100. In these embodiments, the directional coupler 100 comprises two printed circuit board parts 54a, 54b using a through contact 55 for the connection of the two straight sections 50a, 50b via the third section 51. It is possible to use multiple circuit boards, each board 48 comprising two circuit board parts 54a, 54b to improve the impedance measuring.

In the embodiments according to FIG. 3a and according to FIGS. 5 to 7 the RF-power line or main conductor line 39 of the directional coupler 100 comprises an input-line-section 39a and an output line section 39b, both being arranged perpendicular to the straight sections 50a, 50b of the U-shaped directional coupler 100, but at the free ends of the U-section. The input-line-section 39a and the output line section 39b are arranged in one RF-axis.

FIG. 8 shows another embodiment according to the invention, wherein the VI-sensor unit 40 is placed in parallel to the circuit board part 54b of the directional coupler 100. The coupling element 38a is arranged on the circuit board part 54a (as shown in FIGS. 3a and 3b) and coupling element 38b is arranged on the circuit board part 54b. This embodiment of the directional coupler 100 and the VI sensor unit 40 enables a very compact arrangement and therefore advantageously saving space for easier implementation. This is achieved with the printed circuit boards being stacked together.

FIG. 9 depicts a further embodiment of the directional coupler using the through contact 55 for the connection of the two straight sections 50a, 50b. A further VI-sensor unit 40' can be arranged in parallel to the first VI-sensor unit 40, but on the opposite side of the circuit board 48 or directional coupler 100. Further, each VI-sensor 40, 40' is arranged in parallel to the coupling elements 38a, 38b as shown in FIG. 3a. The VI-sensor unit 40, 40' for measuring a voltage and a current each comprises a flat case 44 with flat sides 45, with a flat inner surface 46. The flat surfaces of the VI-probe-sensors 40, 40' are arranged essentially at the same plane of the circuit board part 54a, 54b of the circuit board 48 and/or in continuation of a small side of the directional coupler 100. This embodiment illustrates the use of a multi-stacked structure, using multiple printed circuit boards for advantageous RF power measurements along an RF power delivery line 39a, 50a, 51, 50b, 39b: the integration of VI sensor units with a directional coupler in a compact manner using a U-shape planar arrangement of the main RF conductor line and using multi-stacked printed circuit boards to accomodate the coupling elements of the directional coupler and the probing elements of the VI sensor units allow to save space compared to previously known power sensing elements.

In the embodiments of FIG. 6-9 the circuit board 48 has a first and a second printed circuit board part. The main conductor line 39 comprises two straight sections 50a, 50b, each arranged on the corresponding printed circuit board part, wherein the straight sections 50a, 50b, are interconnected via a third section 51, such as a connection bridge, which passes through the printed circuit board parts building a through connection 55 or through contact 55.

In all embodiments according to FIG. 3 to FIG. 9 the directional coupler 100 comprises the first coupling element 38a and the second coupling element 38b. Each coupling element 38a, 38b is arranged sectionally parallel to the main conductor line 39 enabling adequate power measurements. The second coupling element 38b is configured for a forward running wave FWD and the first coupling element 38a is configured for a reflected wave RFL. The first coupling element 38a is arranged at an opposite side of the second coupling element 38b, which also means at different circuit board sides.

FIG. 10 depicts areas Z1 to Z3 in a Smith diagram or Smith chart regarding measurements of certain values of impedance. The Smith chart is a graphical representation of the complex impedance for radio frequency (RF) engineering. It supports solving problems with transmission lines and matching circuits. The Smith chart can be used to simultaneously display multiple parameters including impedances (complex value Z), admittances, reflection coefficients, scattering parameters, noise figure circles, constant gain contours and regions for unconditional stability.

FIG. 10 further depicts three regions Z1, to Z3, when using the inventive directional coupler 100 comprising a VI-sensor unit 40 for impedance measuring.

When measuring RF voltage and/or RF power using the directional coupler 100 according to the invention, the measured signals of the directional coupler 100 and the measured voltage and current values of the VI sensor unit 40 are combined. In case, one of the measured signals has a low or zero level, the sensitivity of the measurement required to determine impedance is unaffected because one or the other measurement probe will always have an adequate resolution. In other words either the RF voltage and RF current can be well-resolved or if that is not the case, then the reflected and transmitted RF power can be well-resolved as is explained with the following.

The region Z1 in FIG. 10 (near impedance matched) corresponds to a parameter area where the reflected power gets very small and may be difficult to be measured accurately with only a direction coupler because resolving the very low signal corresponding to the reflected power is difficult. Therefore, a combination of directional coupler and VI probe may be especially advantageous in that case because both the Voltage and current signals can be well reolved in region Z1.

The region Z2 (near short circuit) corresponds to a parameter area where the voltage gets very small and may be difficult to be measured very accurately with only a VI probe because resolving the very low voltage signal is difficult. Therefore, a combination of VI probe and direction coupler may be especially advantageous in that case because both the forward and reflected power can be well resolved in region Z2.

The region Z3 (near open circuit) corresponds to a parameter area where the current gets very small and may be difficult to be measured very accurately with only a VI probe because resolving the very low current signal is difficult. Therefore, a combination of VI probe and directional coupler may be especially advantageous in that case because both the forward and the reflected power can be well resolved in region Z3.

So, in order to be able to accurately measure parameters relevant for impedance matching in all possible scenarios (incl. near open circuit, near short circuit and near perfect match area), it is advantageous to use a VI and directional coupler combination. It is especially advantageous to have this combination in a compact set up like the one provided by the various embodiments according to the invention.

By using the inventive directional coupler 100, which comprises a VI-probe 40 according to the invention it is advantageously possible to perform a method for impedance matching a power generator output radio-frequency signal with a load impedance created by a plasma processing chamber. This method comprises the steps of generating a radio frequency signal Amplifying the radio-frequency signal into a high power radio-frequency signal at the output of a radio-frequency generator. Providing the high power radio-frequency signal from the output of the generator to electrodes of a plasma-processing chamber. Measuring a forward-reflected power characteristic using a directional coupler according to the invention to sample the power delivered into the plasma-processing chamber. Adjusting either the radio frequency signal generation (phase, amplitude, waveform and/or frequency) or the amplification of the radio frequency signal based on the sampling of the power delivered into the plasma of the plasma-processing chamber.

It should be expressly noted that one subject matter of the invention can be advantageously combined with another subject matter of the above aspects of the invention and/or with features shown in the drawings, namely either individually or in any combination cumulatively.

LIST OF REFERENCE SIGNS

1 RF-generator/RF supply
2 power meters (directional couplers)
3 I sensing coil

4 V probe
6 plasma chamber
7 electrode
8 plasma
10 power supply and diagnostic
11 Impedance match network
12 power application/load and diagnostic
38a first coupling element
38b second coupling element
39 Main conductor line; RF-power line
39a input line section
39b output line section
40 VI-sensor unit
40' VI-sensor unit
44 flat case
45 flat sides
46 flat inner surface
47 opening
48 circuit board
50a first straight section
50b second straight section
51 third section; connecting leg
52 small sides
53 long sides
54a first circuit board part
54b second circuit board part
55 through contact
100 directional coupler

The invention claimed is:

1. A directional coupler comprising:
   a main conductor line that changes directions and for receiving a high power signal, the main conductor line comprising at least two straight sections and a third section; and
   at least one coupling element,
   wherein the main conductor line is arranged to run in a plane ($P_0$),
   wherein the at least one coupling element is arranged sectionally parallel to the main conductor line,
   wherein the directional coupler is arranged on a circuit board, the circuit board comprising a first and a second circuit board part,
   wherein each of the at least two straight sections is arranged on the respective circuit board part, and
   wherein the at least two straight sections are connected by the third section, the third section comprised of a connection bridge or a contact passing through the first and the second circuit board part.

2. The directional coupler according to claim 1, wherein the at least two straight sections and the third section are shaped to essentially create a U-shaped main conductor line.

3. The directional coupler according to claim 1, wherein the third section is arranged in a plane essentially perpendicular to each of the at least two straight sections.

4. The directional coupler according to claim 1, wherein the third section and the at least two straight sections are configured as a one-piece or multi-part main conductor line.

5. The directional coupler according to claim 1, further comprising a VI-sensor unit for measuring a voltage (V) and a current (I), wherein the VI-sensor unit is arranged adjacent to one of the at least two straight sections and in parallel to the circuit board.

6. The directional coupler according to claim 5, wherein the VI-sensor unit further comprising a flat case with flat sides and with a flat inner surface, and the flat inner surface is arranged adjacent to one of the at least two straight sections and in parallel to the circuit board.

7. The directional coupler according to claim 6, wherein the flat case further comprises a flat outer surface, and wherein the flat inner surface and the flat outer surface of the flat case are arranged essentially at the same plane and in continuation of a small side or top side of the directional coupler on the circuit board.

8. A method for measuring an RF voltage and/or an RF power using a directional coupler according to claim 5, comprising combining measured signals of the directional coupler and the measured voltage and current values of the VI sensor unit and in case, one of the measured signals has a low or zero level, increasing the sensitivity of measuring of the RF voltage and/or the RF power.

9. The directional coupler according to claim 1, wherein the directional coupler and the main conductor line are arranged on multiple circuit boards forming a multi-layered structure, wherein each of the multiple circuit boards comprises the first and the second circuit board parts, wherein each of the at least two straight sections is arranged on the respective circuit board parts of each of the multiple circuit boards.

10. The directional coupler according to claim 9, wherein the directional coupler and the main conductor line are arranged on the multiple circuit boards forming a two-layer structure, and the multiple circuit boards having a distance and an angle to each other.

11. The directional coupler according to claim 10, wherein the multiple circuit boards are jointly arranged on a metallic ground layer.

12. A method for impedance matching a power generator output radio-frequency signal with a load impedance created by a plasma processing chamber, comprising:
   generating a radio-frequency signal;
   amplifying the radio-frequency signal into a high power radio-frequency signal at the output of a radio-frequency generator;
   providing the high power radio-frequency signal from the output of the generator to electrodes of a plasma processing chamber;
   measuring a forward-reflected power characteristic using a directional coupler according to claim 1, to sample the power delivered into the plasma processing chamber; and
   adjusting either the radio frequency signal generation or the amplification of the radio frequency signal based on the sampling of the power delivered into the plasma of the plasma processing chamber.

* * * * *